(12) United States Patent
Liu

(10) Patent No.: US 7,263,054 B2
(45) Date of Patent: Aug. 28, 2007

(54) SAMPLE-AND-HOLD INTERFACE CIRCUIT OF A PICKUP HEAD

(75) Inventor: Chih-Min Liu, Taipei (TW)

(73) Assignee: Via Technologies Inc., Hsin-Tien, Taipei (TW)

( * ) Notice: Subject to any disclaimer, the term of this patent is extended or adjusted under 35 U.S.C. 154(b) by 573 days.

(21) Appl. No.: 10/926,961

(22) Filed: Aug. 27, 2004

(65) Prior Publication Data

US 2005/0213475 A1  Sep. 29, 2005

(30) Foreign Application Priority Data

Mar. 25, 2004   (TW) .............................. 93108191 A

(51) Int. Cl.
G11B 7/00 (2006.01)
(52) U.S. Cl. .............................. 369/124.12; 369/59.21; 369/47.35

(58) Field of Classification Search ........... 369/124.05, 369/124.01, 124.12, 59.21, 47.35
See application file for complete search history.

(56) References Cited

U.S. PATENT DOCUMENTS 6,643,239 B2 * 11/2003 Nakajo ..................... 369/53.26

* cited by examiner

*Primary Examiner*—Nabil Hindi
(74) *Attorney, Agent, or Firm*—Birch, Stewart, Kolasch & Birch, LLP

(57) ABSTRACT

A sample-and-hold interface circuit of a pickup head uses a circuit switch to control a voltage divider. When the circuit switch receives a signal Break, a voltage divider does not consume extra power to decrease the driving power consumption of a pickup head. And a controller can sample an unattenuated input signal to increase the signal/noise ratio.

20 Claims, 3 Drawing Sheets

SAMPLE-AND-HOLD INTERFACE CIRCUIT OF A PICKUP HEAD

BACKGROUND OF THE INVENTION

1. Field of the Invention

The present invention relates to an interface circuit, and more particularly to a sample-and-hold circuit to work between chips or circuits with different working voltages to provide a sample-and-hold function and protect the chips or circuits with a lower working voltage when operating at a higher voltage.

2. Description of the Prior Art

When a signal travels from a chip or circuit with higher working voltage to a chip or circuit with lower working voltage, there must be an interface circuit between the two chips or circuits to attenuate the signal to the range that the chip or circuit with lower working voltage can tolerate. For example, a pickup head usually works at 5V, and the controller of a DVD player works at 3.3V. If the writing voltage (3.3V-5V) of a pickup head inputs to a sample-and-hold circuit, like a Switched-OP, of a controller directly for a long time, the oxide layer manufactured in 3.3V process at the input terminal of the Switched-OP will break down to destroy the controller eternally. The prior art is shown as FIG. 1. A voltage divider, comprising a first resistor 1 and a second resistor 2, is used to attenuate an input signal of a sample-and-hold circuit 3 down to the level lower than 3.3V to prevent this problem.

But in the above situation, the pickup head has to provide extra current "I" to the voltage divider. The extra current produces extra power consumption and thermal noise. Besides, the bigger the resistors are, the longer the setup time of the input of the Switched-OP is. Then the practical sampling time is decreased. Furthermore, the writing voltage unnecessary to be sampled and the reading voltage necessary to be sampled are both attenuated. The attenuated reading voltage combing with the noise at the back end makes the signal/noise ratio lower.

SUMMARY OF THE INVENTION

Obviously, the prior art mentioned in the above cannot satisfy the requirement of low power operation. One of the purposes of the present invention is to control the voltage divider to be open-circuit on the character that only a writing voltage needs to be attenuated when the input is a reading voltage to decrease power consumption without providing extra current.

Another purpose of the present invention is to increase the signal/noise ratio when the input is a reading voltage without being attenuated by the voltage divider.

A sample-and-hold interface circuit of a pickup head includes a pair of resistors in serial (voltage divider), a Switched-OP, a PMOS transistor and a timing circuit. The voltage divider can attenuate an input voltage to protect the Switched-OP with a lower working voltage. The Switched-OP provides a sample-and-hold function. The PMOS transistor works as the switch of the voltage divider. When the PMOS transistor is on, the pair of the resistors in serial work as a voltage divider. When the PMOS transistor is off, the pair of the resistors in serial is open-circuit. The timing circuit is used to control the on and off of the PMOS, and the timing for the Switched-OP to sample and hold.

BRIEF DESCRIPTION OF THE DRAWINGS

The accompanying drawings incorporated in and forming a part of the specification illustrated several aspects of the present invention, and together with the description serve to explain the principles of the invention. In the drawings.

DESCRIPTION OF THE INVENTION

Figure 1:
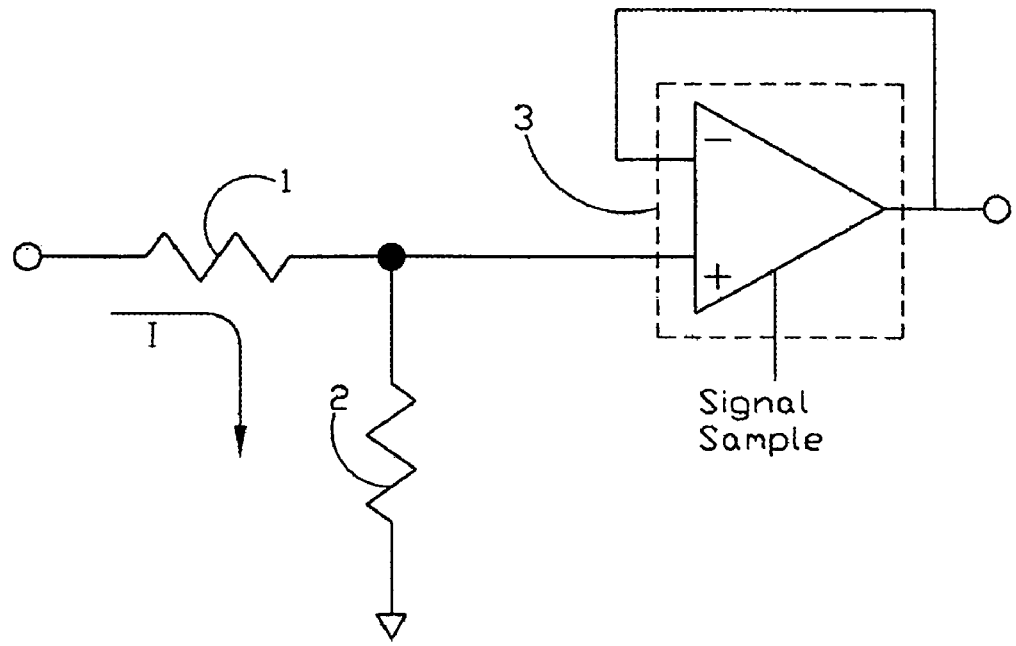
FIG. 1 is a diagram of the prior art of a sample-and-hold interface circuit.
Figure 2:
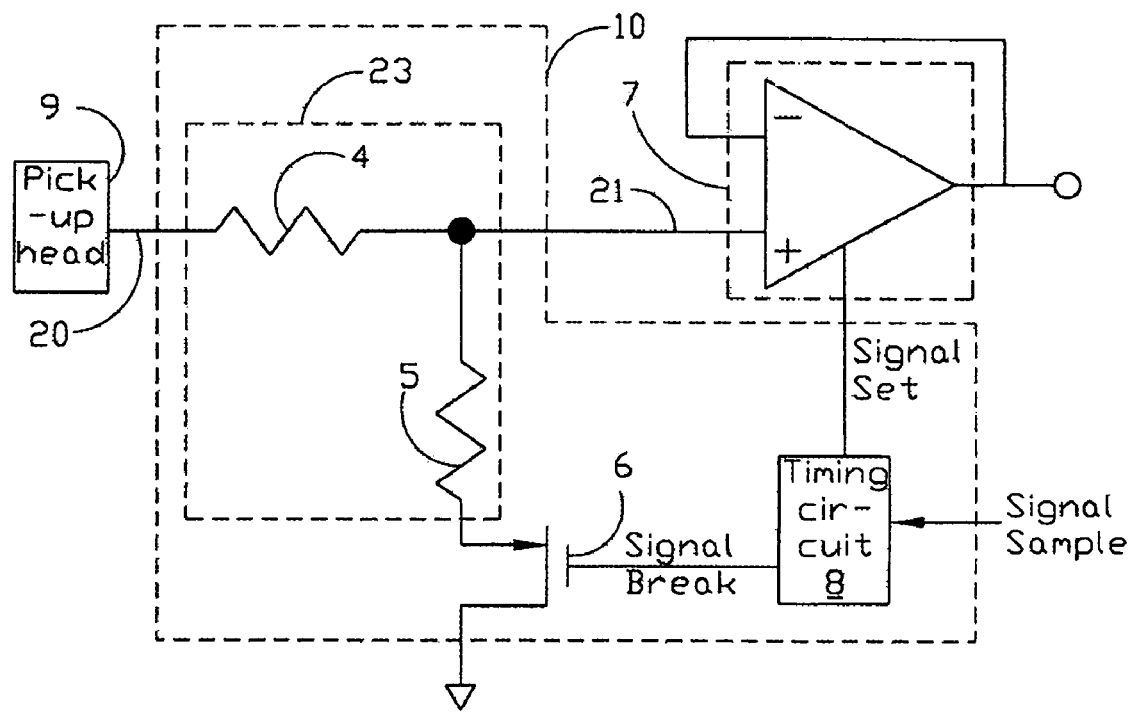
FIG. 2 is an embodiment of the present invention, a sample-and-hold interface circuit of a pickup head.

Referring to FIG. 2, it is one of the embodiments of the invention. An input signal 20 is sent from a pickup head 9 with 5V working voltage to a DVD control chip with working voltage 3.3V The input signal 20 processed by an interface circuit 10 is sent to a sample-and-hold circuit 7 of a DVD control chip, like a Switched-OP, to ensure the safety of the DVD control chip. The interface circuit 10 in this embodiment includes a voltage divider 23, a circuit switch 6, and a timing circuit 8. In the embodiment, the voltage divider 23 including a pair of resistors 4 and 5 is connected to the sample-and-hold circuit 7 and the circuit switch 6. A control signal 21 is output from the point between the serial resistors 4 and 5 to the sample-and-hold circuit 7.

The sample-and-hold circuit 7 works for sampling the control signal 21. The circuit switch 6 is in serial with the voltage divider 23, and connected to the timing circuit 8. In the embodiment, the circuit switch 6 includes a PMOS transistor connected the resistor 5 with the source, a low voltage, like ground, with the drain and timing circuit 8 with the gate. The circuit switch 6 works to control the voltage divider 23 to determine the character of the control signal 21, like the amplitude. The timing circuit 8 is connected to the circuit switch 6 and sample-and-hold circuit 7. The timing circuit 8 controls the on and off of the circuit switch 6 with a switching signal (signal Break), and the sampling of the sample-and-hold circuit 7 with a signal Set after receiving an activating signal (signal Sample).

Before inputting a writing voltage (3.3V-5V), a signal Sample will control the timing circuit 8 to make both of the signal Break and signal Sample at 0. At this moment, the circuit switch 6 is on, and the input signal 20 within the range of the writing voltage (3.3V-5V) is input afterward. The input signal 20 becomes the control signal 21 after attenuated by the voltage divider 23, and partial the input signal 20 is sent to circuit switch 6. At this moment, the present invention works as the prior art. After the input writing voltage is attenuated by the voltage divider 23, the input voltage of the sample-and-hold circuit 7 is not over 3.3V When the pickup head is inputting a reading voltage (1.4V-2.8V), the signal Sample will control the timing circuit 8 to make both of the signal Break and signal Sample at 1, then the circuit switch 6 becomes off. At this moment, the resistor 5 is open-circuit and the voltage divider 23 cannot divide the voltage. Then the input voltage of the sample-and-hold circuit 7 approaches to the reading voltage. That means the input signal 20 is approximately equal to the control signal 21 output from the voltage divider 23. The pickup head 9 does not need to provide extra current to drive the resistor 5, therefore the power consumption can be reduced.

Figure 3:
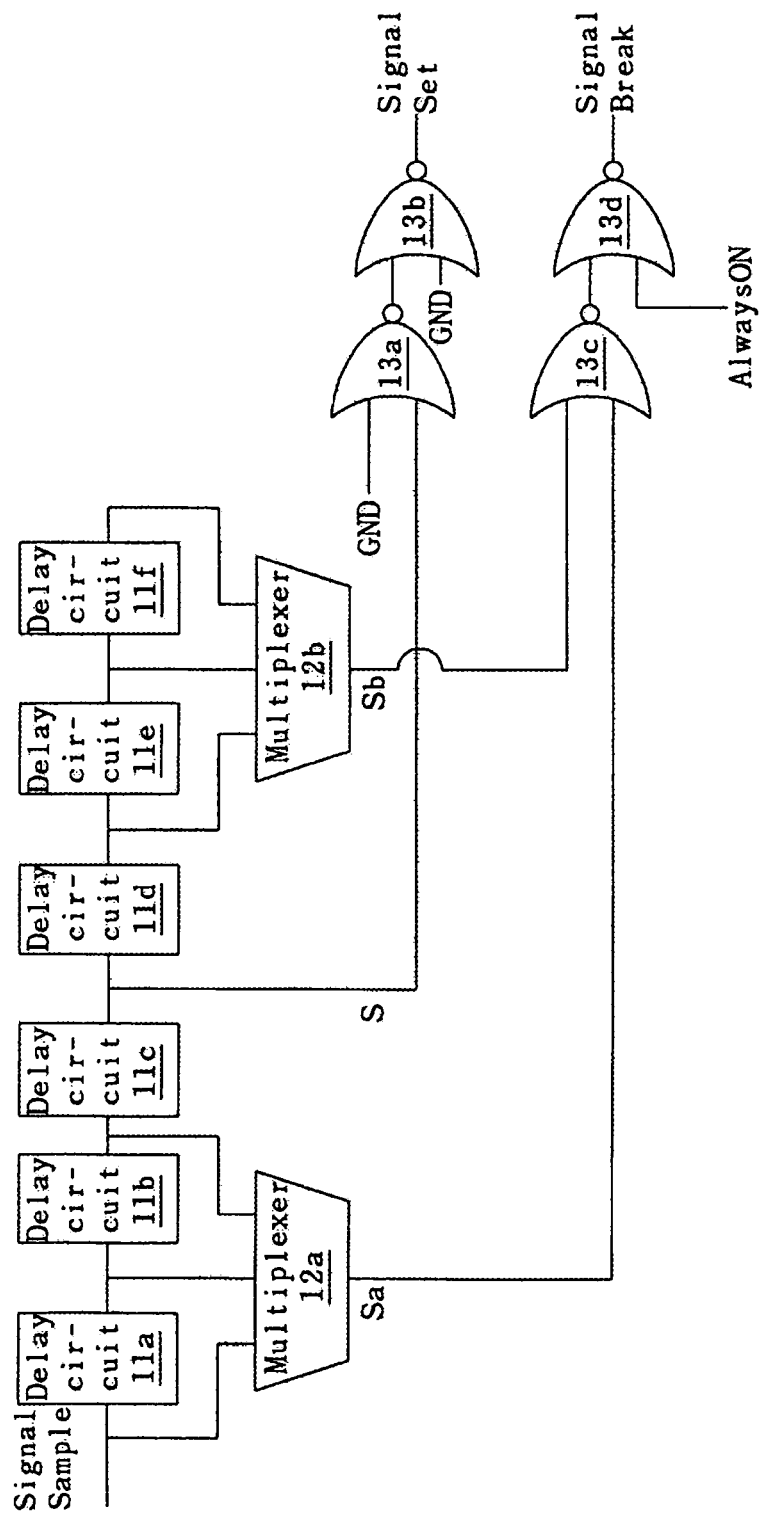
FIG. 3 is an embodiment of the timing circuit of the present invention.

FIG. 3 is one of the embodiments of the timing circuit 8. It includes a delay path including six delay circuits, 11a, 11b, 11c, 11d, 11e and 11f in serial, two multiplexers, 12a, and 12b, and four NOR gates, 13a, 13b, 13c and 13d. The signal Sample of the reading and writing enters the delay circuit of 11a of the delay path. Signal S is output from the middle of the delay path, like the point between the 11c and 11d, and becomes signal Set after passing through two serial NOR gates, 13a and 13b. Each of the NOR gate 13a and 13b is connected to the ground with an input, therefore, they work as two serial inverters. Logically, the signal Sample is equivalent to the signal S.

Figure 4:
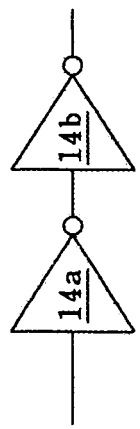
FIG. 4 is an embodiment of the delay circuit of the present invention.

Signal Sa and Sb are output from multiplexer 12a and 12b respectively, and equivalent to signal S in logic, but their delay times are different. The delay times of the signal Sa and Sb can be selected by the control signals of the multiplexer 12a and 12b. The signal Sa and Sb are processed by two NOR gates 13c and 13d in serial to be output as the signal Break. One of the input of the NOR gate 13d is signal AlwaysOn. When the signal AlwaysOn is 0, the NOR gate 13d works as an inverter, and then the signal Break is equivalent to Sa+Sb in logic. When the signal AlwaysOn is 1, the signal Break output from the NOR gate 13d is always 0. The voltage divider 23 attenuates the input signal 20 to protect the DVD control chip. FIG. 4 shows the diagram of the delay circuit of the present invention, including two serial inverters, 14a and 14b.

Figure 5:
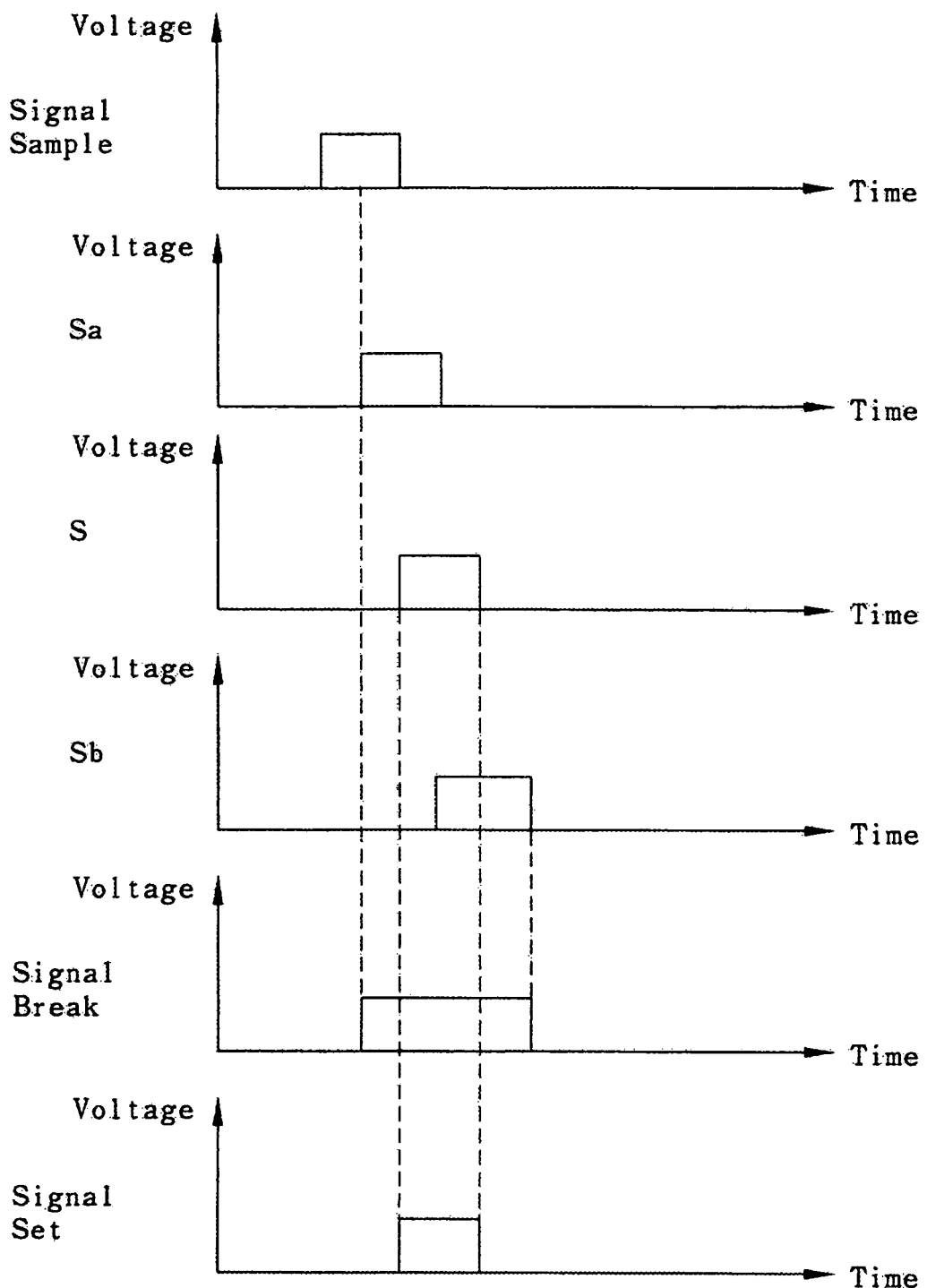
FIG. 5 is the signal timing diagram of the timing circuit.

FIG. 5 is the timing diagram of the related timing of the timing circuit. When the writing voltage (3.3V-5V) output becomes the reading voltage (1.4V-2.8V) output, an internal controller (not shown in the drawings) makes the signal Sample turn 0 into 1, passing through the delay circuits in FIG. 3 to generate the signal Sa, Sb and S. At this moment, the AlwaysOn is 0, therefore, the signal Break is like Sa+Sb logically. It shows in FIG. 5 that the length of the signal Break is as the same as the length from the beginning of the signal Sa to the end of the signal Sb. Because the sample-and-hold circuit 7 is not expecting to sample an attenuated reading voltage value, the length of the signal Break is a little longer than the length of the signal Set to ensure that the length of the input as a reading voltage through switching the sample-and-hold circuit 7 by signal Set can be selected by the multiplexer 12a and 12b when the resistor 5 of the voltage divider 23 in FIG. 2 is open-circuit.

While the described embodiment represents the preferred form of the present invention, it is to be understood that modifications will occur to those skilled in that art without departing from the spirit of the invention. The scope of the invention is therefore to be determined solely by the appended claims.

What is claimed is:

1. A sample-and-hold interface circuit of a pickup head, including:
    a voltage divider to receive an input signal and output a control signal;
    a circuit switch to control the voltage divider to attenuate the input signal; and
    a timing circuit to control the circuit switch by a switching signal.

2. The sample-and-hold interface circuit of a pickup head as recited in claim 1, wherein the voltage divider includes a pair of serial resistors, wherein a sample-and-hold circuit is connected to a point between the pair of the serial resistors.

3. The sample-and-hold interface circuit of a pickup head as recited in claim 1, wherein the circuit switch includes a P-type metal-oxide-silicon (PMOS) transistor connected between the voltage divider and a lower voltage than the input signal in serial.

4. The sample-and-hold interface circuit of a pickup head as recited in claim 3, wherein the P-MOS transistor controls the voltage divider to attenuate the input signal to become the control signal when the PMOS transistor is on.

5. The sample-and-hold interface circuit of a pickup head as recited in claim 3, wherein the input signal is approximately equal to the control signal when the PMOS transistor is off.

6. The sample-and-hold interface circuit of a pickup head as recited in claim 1, wherein the timing circuit includes a plurality of delay circuits, multiplexers and NOR gates.

7. The sample-and-hold interface circuit of a pickup head as recited in claim 6, wherein each of the delay circuits includes a pair of inverters.

8. The sample-and-hold interface circuit of a pickup head as recited in claim 6, wherein the plurality of the multiplexer are to select a length of the switching signal.

9. The sample-and-hold interface circuit of a pickup head as recited in claim 1, wherein the circuit switch is off when a value of the switching signal is 1, and the circuit switch is on when the value of the switching signal is 0.

10. A sample-and-hold interface system of a pickup head, including:
    a voltage divider to receive an input signal and output a control signal;
    a sample-and-hold-hold circuit to generate an output signal after receiving the control signal;
    a circuit switch to control the voltage divider to attenuate the input signal; and
    a timming circuit to control the circuit switch by a switching signal, and control the sample-and-hold circuit by an activating signal.

11. The sample-and-hold interface system of a pickup head as recited in claim 10, wherein the voltage divider includes a pair of serial resistors, wherein the sample-and-hold circuit is connected to a point between the pair of the serial resistors.

12. The sample-and-hold interface system of a pickup head as recited in claim 10, wherein the circuit switch includes a PMOS transistor connected between the voltage divider and a reference voltage.

13. The sample-and-hold interface system of a pickup head as recited in claim 12, wherein the PMOS transistor controls the voltage divider to attenuate the input signal to become the control signal when the PMOS transistor is on.

14. The sample-and-hold interface system of a pickup head as recited in claim 12, wherein the input signal is approximately equal to the control signal when the PMOS transistor is off.

15. The sample-and-hold interface system of a pickup head as recited in claim 10, wherein the timing circuit includes a plurality of delay circuits, multiplexers and NOR gates.

16. The sample-and-hold interface system of a pickup head as recited in claim 15, wherein each of the delay circuits includes a pair of inverters.

17. The sample-and-hold interface system of a pickup head as recited in claim 15, wherein the plurality of the multiplexer are to select a length of the switching signal.

18. The sample-and-hold interface system of a pickup head as recited in claim 15, wherein the circuit switch is off when a value of the switching signal is 1, and the circuit switch is on when the value of the switching signal is 0.

19. The interface system of a pickup head as recited in claim 10, wherein the sample-and-hold circuit executes sampling the control signal when a value of the activating signal is 1, and executes holding the control signal when the value of the activating signal is 0.

20. The sample-and-hold interface system of a pickup head as recited in claim 15, the sample-and-hold circuit includes a Switched-operation-amplifier to sample and hold the control signal.

* * * * *